United States Patent [19]
Akram et al.

[11] Patent Number: 5,789,278
[45] Date of Patent: Aug. 4, 1998

[54] METHOD FOR FABRICATING CHIP MODULES

[75] Inventors: Salman Akram; Alan G. Wood, both of Boise; Warren M. Farnworth, Nampa, all of Id.

[73] Assignee: Micron Technology, Inc., Boise, Id.

[21] Appl. No.: 688,368

[22] Filed: Jul. 30, 1996

[51] Int. Cl.$^6$ .................................................. H01L 21/44
[52] U.S. Cl. .................................................. 438/118; 438/119
[58] Field of Search .................................. 438/118, 119

[56] References Cited

U.S. PATENT DOCUMENTS

| | | | |
|---|---|---|---|
| 4,899,921 | 2/1990 | Bendat et al. | 228/105 |
| 4,937,653 | 6/1990 | Blonder et al. | 357/68 |
| 4,992,850 | 2/1991 | Corbett et al. | 357/72 |
| 5,072,289 | 12/1991 | Sugimoto et al. | 357/68 |
| 5,206,585 | 4/1993 | Chang et al. | 324/158 P |
| 5,249,450 | 10/1993 | Wood et al. | 72/359 |
| 5,262,718 | 11/1993 | Svendsen et al. | 324/158 P |
| 5,326,428 | 7/1994 | Farnworth et al. | 156/654 |
| 5,408,190 | 4/1995 | Wood et al. | 324/765 |
| 5,419,807 | 5/1995 | Akram et al. | 156/647.1 |
| 5,428,223 | 6/1995 | Higashi et al. | 257/774 |
| 5,440,240 | 8/1995 | Wood et al. | 324/765 |
| 5,458,694 | 10/1995 | Nuyen | 438/118 |
| 5,474,620 | 12/1995 | Nath et al. | 438/118 |
| 5,478,779 | 12/1995 | Akram | 437/189 |
| 5,483,174 | 1/1996 | Hembree et al. | 324/765 |
| 5,483,741 | 1/1996 | Akram et al. | 29/846 |
| 5,487,999 | 1/1996 | Farnworth | 437/7 |
| 5,519,332 | 5/1996 | Wood et al. | 324/755 |
| 5,578,526 | 11/1996 | Akram et al. | 437/209 |
| 5,578,537 | 11/1996 | Chang et al. | 438/119 |
| 5,607,818 | 3/1997 | Akram et al. | 430/311 |
| 5,634,267 | 6/1997 | Farnworth et al. | 29/840 |
| 5,661,042 | 8/1997 | Fang et al. | 438/119 |
| 5,668,059 | 9/1997 | Christie et al. | 438/114 |
| 5,678,301 | 10/1997 | Gochnour et al. | 29/827 |

OTHER PUBLICATIONS

Yamamoto, Yasuhikio et al., "Evaluation of New Micro–Connection System Using Microbumps", Nitto Denko Corp., Technical Paper, ISHM '93 Proceedings, pp. 370–378.

Miyake, Kiyoshi et al., "Connectivity Analysis of New 'Known Good Die' Connection System Using Microbumps", Technical Report, Nitto Denko Corp., pp. 1–7, 1994.

Zilber, G. et al., "Slimcase—A Thin Chip Size, Integrated Circuit Package", ShellCass Ltd., MANHAT, Brochure, pp. 2–8, 1996.

*Primary Examiner*—Kevin Picardat
*Attorney, Agent, or Firm*—Stephen A. Gratton

[57] ABSTRACT

A method for forming a chip module such as a multi chip module or a memory module is provided. The multi chip module includes a substrate configured to mount a plurality of semiconductor dice thereon. The substrate includes raised contact members formed in patterns that correspond to the locations of bond pads on the dice. An anisotropic conductive adhesive layer is formed between the contact members on the substrate and the bond pads on the dice to secure the dice to the substrate and form an electrical connection therebetween. In addition, an underfill layer can be formed between the dice and substrate to fill the gap therebetween and further secure the dice to the substrate. Conductors and input/output pads formed on the substrate form electrical paths to and from the contact members. To form a memory module, one or more multi chip modules can be mounted to a supporting substrate having an edge connector in electrical communication with the conductors and with contact members on the substrates.

31 Claims, 5 Drawing Sheets

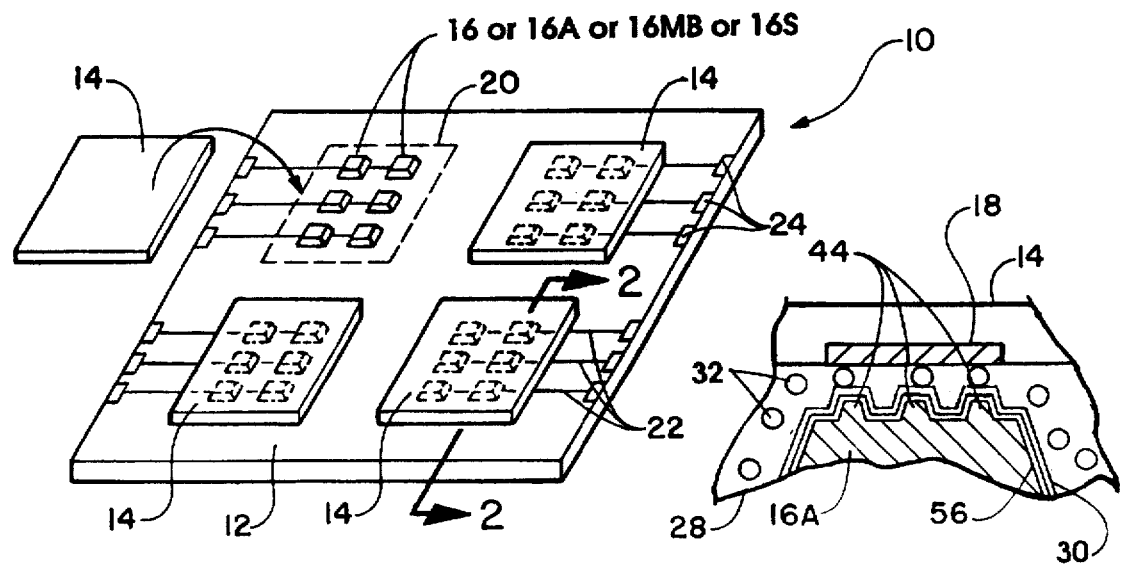
FIGURE 1
FIGURE 2A
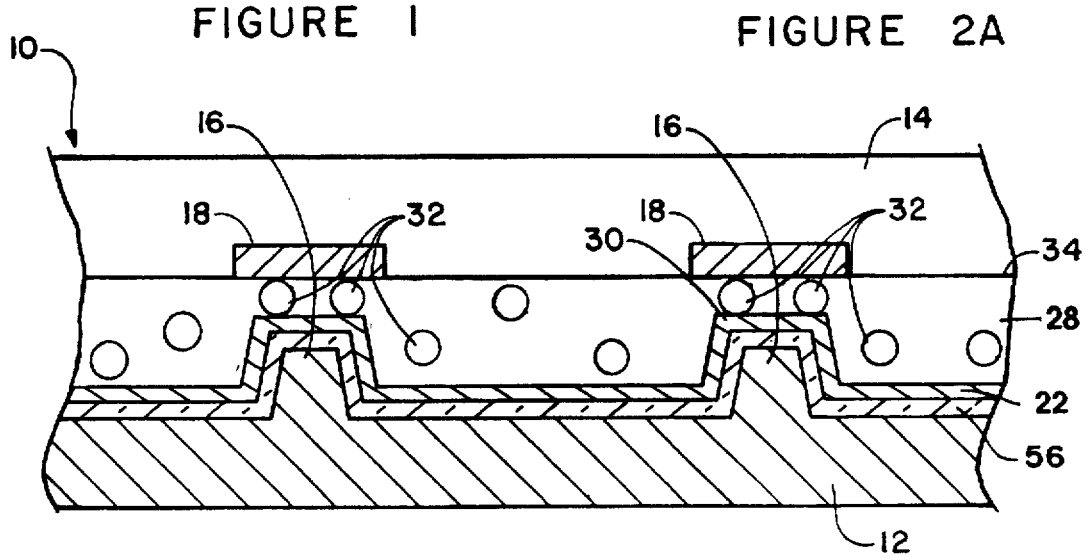
FIGURE 2
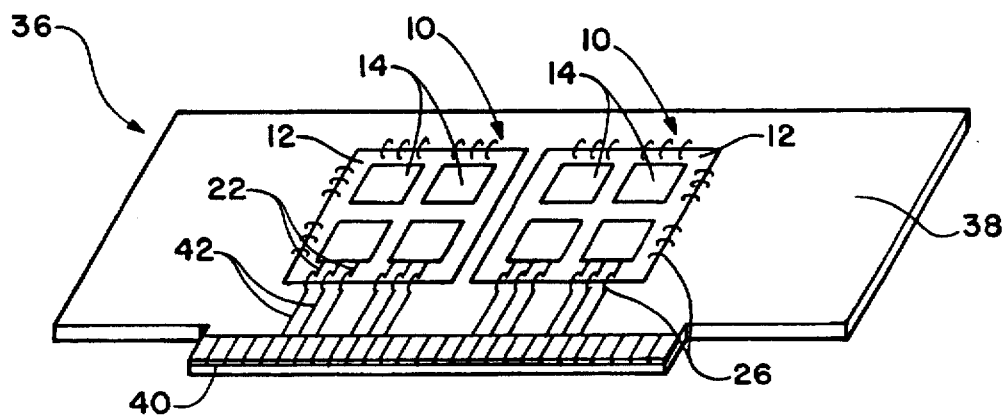
FIGURE 3

METHOD FOR FABRICATING CHIP MODULES

FIELD OF THE INVENTION

This invention relates to an improved method for fabricating chip modules such as multi chip modules and memory modules.

BACKGROUND OF THE INVENTION

Microelectronics packages called "multi chip modules" (MCM) can be constructed with semiconductor dice. Typically the dice are in a bare or unpackaged form. Non-conventionally packaged dice such as chip scale packages can also be used to construct multi chip modules. With a multi chip module, a number of dice are attached to a printed circuit board or other substrate and electrically connected to form various circuits and electronic devices.

For example, one type of multi chip module is a single in line memory module (SIMM). With a SIMM, several memory devices such as DRAMs are mounted on a printed circuit board having an edge connector. The SIMM is designed to plug into a computer socket in electrical communication with address, data and power supply buses for the computer.

One reason for the increased use of multi chip modules is increased system performance. In particular, the integrated circuits on the dice can be operated with lower resistance and parasitic capacitances. This is largely a result of decreasing the interconnection length between the dice. In addition, overall system performance is improved because the input/output ports can be configured to access the whole module, which can be organized to reduce signal delays and access times. The power requirements are also reduced due to a reduction in the driver requirements.

Typically the dice are mounted on a substrate having an interconnect pattern formed using a process such as screen printing. Different techniques are used for mounting the dice to the substrate and for providing interconnection and termination of the unpackaged dice. These techniques include wire bonding, tape automated bonding (TAB), micro-bump bonding and flip chip bonding.

For example, with flip chip bonding, each die is mounted circuit side down, and bond pads on the die are bonded to corresponding connection points on the substrate. Flip chips are formed similarly to conventional dice but require additional process steps to form solder bumps on the bond pads. The solder bumps are typically formed with a height of from 25 μm to 75 μm. The solder bumps separate the dice from the substrate and minimize the physical contact between the dice and substrate.

One important consideration in fabricating multi chip modules is the electrical connection between the bond pads on the dice and the connection points on the substrate. It is important that these electrical connections be formed with a low resistivity. Additionally, it is preferable that each electrical connection be formed with a minimum amount of damage to the dice and particularly to the bond pads of the dice.

Another important consideration in fabricating multi chip modules is the effect of thermal expansion on the electrical connections. If the dice and substrate expand by a different amount, stress may develop at the connection points and adversely effect the electrical connections. Stresses from thermal expansion can also lead to damage of the dice and substrate.

Yet another consideration in the fabrication of multi chip modules is that the size of semiconductor dice and the size and spacing of the bond pads on the dice have become smaller. This makes mounting and interconnecting of the dice on a substrate more difficult. This is especially true with components in which it may be necessary to integrate a large number of dice onto a single substrate.

In view of these and other problems associated with fabricating chip modules such as multi chip modules and memory modules, improved fabrication processes are needed in the art. The present invention is directed to a method for fabricating chip modules that is low cost and suitable to volume manufacture. In addition, this method provides an improved chip module characterized by a low resistance and reliable permanent electrical connection between the die bond pads and conductors on a supporting substrate.

SUMMARY OF THE INVENTION

In accordance with the present invention, an improved method for forming chip modules such as multi chip modules and memory modules is provided. A multi chip module fabricated in accordance with the method comprises: a substrate having contact members for mounting and interconnecting one or more semiconductor dice; and a conductive adhesive layer for forming a permanent electrical connection between bond pads or other contact locations on the dice, and the contact members on the substrate. The dice can be mounted to the substrate individually or in clusters of from two dice to an entire wafer. The substrate also includes conductors that electrically connect to the contact members and to input/output pads formed along an edge or other portion of the substrate.

In a first embodiment the substrate is formed of an etchable material, such as silicon, and the contact members are etched into the substrate in a pattern that matches the bond pads on the dice. In this embodiment the contact members are covered with a conductive layer in electrical communication with corresponding conductors and input/output pads formed on the substrate. The conductive layer can be formed as a single metal layer or as a bi-metal stack including a base layer and a cap layer formed of a non-oxidizing metal. The cap layer inhibits the formation of oxide on the contact members that can increase the electrical resistance between the contact members and the conductive adhesive layer. The contact members can also include etched projections that function to help force conductive particles within the conductive adhesive layer into electrical contact with the die bond pads and with the contact members on the substrate.

In a second embodiment, the substrate can be formed of silicon or of an insulating material such as a glass filled polymer, FR-4 or a ceramic material. In the second embodiment, microbump contact members and conductors are formed on a flexible tape similar to multi layered TAB tape. In a third embodiment the contact members are formed as metal or conductive polymer bumps formed directly on a pattern of conductors on the substrate. The metal or conductive polymer bump can be formed by screen printing or similar deposition process. Metal bumps can also be formed by a deposition process such as electroplating, electroless plating or evaporation.

In each of the embodiments the conductive adhesive layer between the substrate and dice can be formed of an anisotropic conductive adhesive, such as a z-axis epoxy, configured to provide conductivity in only one direction. The conductive adhesive layer, in addition to forming an electrical path between the die bond pads and the contact members on the substrate, also secures the dice to the substrate. An underfill layer can also be formed in the gap between the dice and substrate to secure the dice to the substrate and to provide further electrical insulation.

A method for forming a chip module, in accordance with the invention includes the broad steps of: providing one or more semiconductor dice; forming a substrate with a pattern of contact members, conductors and input/output pads thereon; forming a conductive adhesive layer on the substrate or dice; aligning the contact members on the substrate with the bond pads on the dice; compressing the conductive adhesive layer between the dice and substrate; and then curing the conductive adhesive layer to secure the dice to the substrate and electrically connect the contact members on the substrate to the bond pads on the dice.

If desired, a carrier can be provided for performing the method. The carrier is adapted to hold the substrate and dice together in alignment and to cure the conductive adhesive layer under compression. The carrier includes a base and a force applying mechanism. Assembly of the carrier and alignment of the dice with the substrate can be performed using an automated or manual aligner bonder apparatus.

BRIEF DESCRIPTION OF THE DRAWINGS

FIG. 1 is a schematic perspective view of a multi chip module constructed in accordance with the invention;

FIG. 2 is an enlarged cross sectional view taken along section line 2—2 of FIG. 1 showing the electrical connection between contact members on a substrate of the module and die bond pads;

FIG. 2A is an enlarged cross sectional view equivalent to FIG. 2 of an alternate embodiment contact member having projections for compressing the conductive adhesive layer;

FIG. 3 is a perspective view of a memory module constructed in accordance with the invention;

DETAILED DESCRIPTION OF THE PREFERRED EMBODIMENT

Figure 4A:
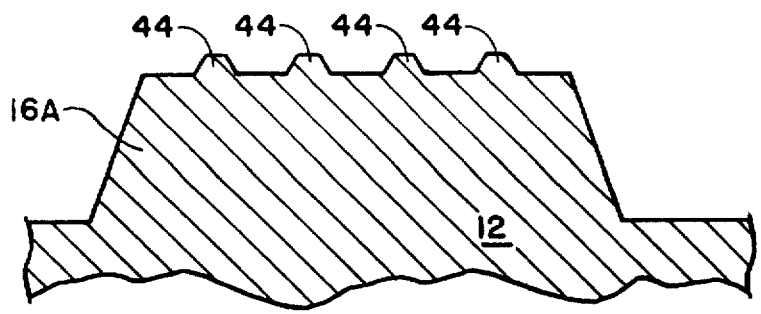
FIGS. 4A–4D are schematic cross sectional views of process steps for forming a contact member on the substrate using an etching process.

Referring to FIG. 1, a multi chip module 10 constructed in accordance with the invention is shown. The multi chip module 10 includes a substrate 12 and a plurality of semiconductor dice 14 mounted on the substrate 12. The substrate 12 includes contact members 16 adapted to electrically connect to the die bond pads 18 (FIG. 2) on the individual dice 14.

Figure 6A:
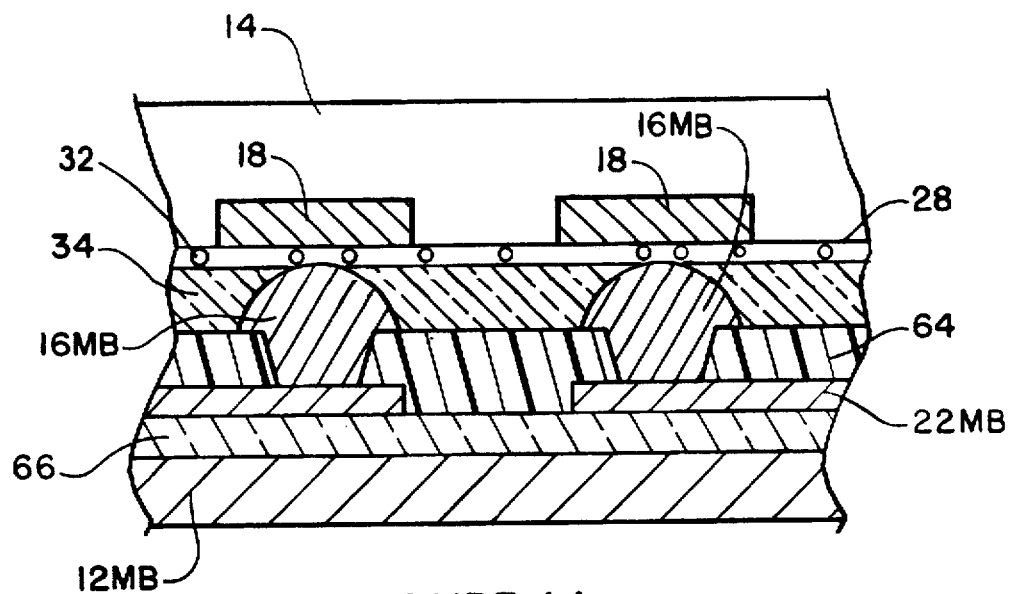
FIG. 6A is a cross sectional view equivalent to FIG. 5D of alternate embodiment microbump contact members and conductors similar to multi layered TAB tape.
Figure 6B:
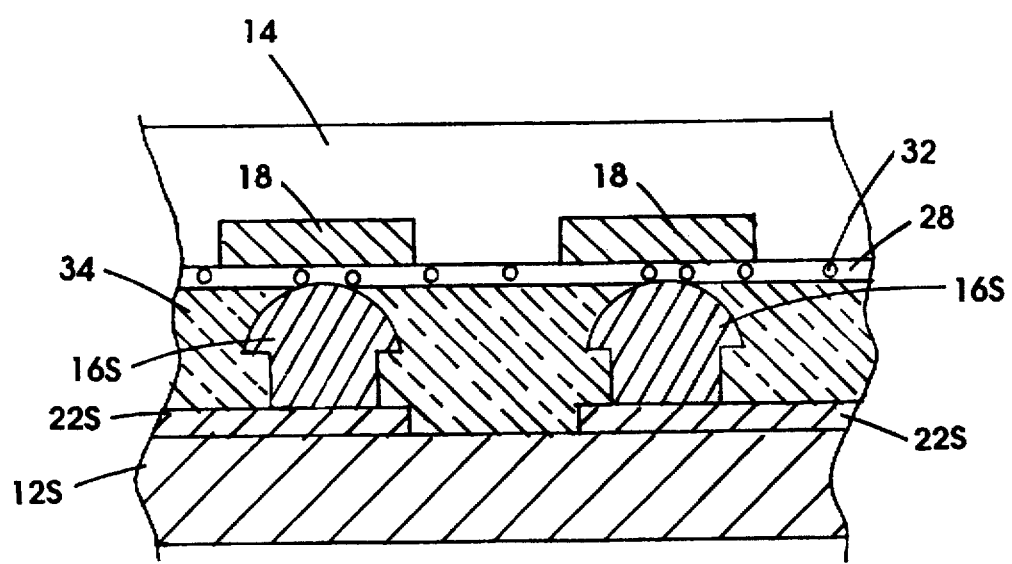
FIG. 6B is a cross sectional view equivalent to FIG. 5D of an alternate embodiment metal or conductive polymer bump contact member formed directly on a pattern of conductors on the substrate.

As will be further explained, the contact members 16 (or contact members 16A—FIG. 2A) can be formed integrally with the substrate 12 using an etching process (FIGS. 4A–4D). Alternately, microbump contact members 16MB can be formed as shown in FIG. 6A using a material similar to multi layered TAB tape. As another alternative, the contact members 16S can be formed as shown in FIG. 6B as stenciled metal or polymer microbumps.

Still referring to FIG. 1, each die 14 mounts to a corresponding bonding site 20 on the substrate 12 which is indicated by the dotted lines. The bonding sites 20 are areas on the substrate 12 having patterns of contact members 16 that match the bond pads 18 for the individual dice 14.

Each contact member 16 is in electrical communication with a conductor 22 formed on the substrate 12. The conductors 22 provide an electrical path to and from the contact members 16 and include contact pads 24 formed along an edge of the substrate 12. The contact pads 24 function as input/output pads for the multi chip module 10. The contact pads 24 are adapted to electrically connect to bond wires 26 (FIG. 3) or other electrical connectors such as contact pins or spring contacts.

The substrate 12 is preferably formed of a material having a coefficient of thermal expansion (CTE) that closely matches that of a silicon die. In the embodiments illustrated in FIGS. 2 and 2A, the substrate 12 can be formed of an etchable semiconductor material such as monocrystalline silicon, silicon-on-glass, silicon-on-sapphire or germanium. In the embodiments illustrated in FIGS. 6A and 6B, the substrate 12MB or 12S can be formed of the above materials or of an insulating material such as a glass filled polymer, an FR-4 material or a ceramic material.

Referring to FIG. 2, the substrate 12 includes an insulating layer 56. In addition, a conductive layer 30 is formed on the substrate 12 to cover the contact members 16. The conductive layer 30 for each contact member 16 is in electrical communication with a corresponding conductor 22. The conductive layer 30 can be formed of a highly conductive metal, such as aluminum or palladium, deposited to a desired thickness and then patterned to cover the contact members 16. As will be further explained, the conductive layer 30 can also be formed as a bi-metal stack that includes a base layer and a non-oxidizing cap layer. The conductive layer 30 can also be formed of a conductive material such as a metal silicide ($TiSi_2$).

The conductors 22 are formed on the substrate 12 in a required pattern to the edges of the substrate 12. The conductors 22 can be formed of a highly conductive metal deposited to a desired thickness and patterned or as a bi-metal stack that includes a base layer and a non-oxidizing cap layer. The conductors 22 can be formed of a same metal as the conductive layer 30 on the contact members 16 using the same metallization process. Alternately the conductors 22 can be formed of a different material than the conductive layer 30 using a separate metallization process.

Still referring to FIG. 2, a conductive adhesive layer 28 is formed between contact members 16 and the bond pads 18 on the dice 14. The conductive adhesive layer 28 is preferably an anisotropic adhesive formed such that electrical resistance in one direction through the material will differ from that measured in another direction. Typically, high resistance can be provided in all directions, while conductivity can be provided in one direction (e.g., z). The conductivity in the one direction can be pressure sensitive, requiring that the material be compressed in that direction during bonding.

One type of anisotropic adhesive suitable for forming the conductive adhesive layer 28 is known as a "z-axis anisotropic adhesive". Z-axis anisotropic adhesives are filled with conductive particles 32 to a low level such that the particles do not contact each other in the xy plane. Compression of the material in the z direction establishes an electrical path.

Z-axis anisotropic adhesives can be formed as a viscous paste or as a film that is applied and then cured to harden. Both types of z-axis anisotropic adhesives (paste or film) come in a thermal plastic or thermal setting variety. Thermal plastic anisotropic adhesives are heated to soften for use and then cooled for curing. Thermal setting anisotropic adhesives require heat curing at temperatures from 100°–300° C. for from several minutes to an hour or more. Suitable z-axis anisotropic adhesives are sold under the trademarks: "X-POLY" and "Z-POXY", by A.I. Technology, Trenton, N.J.; and "SHELL-ZAC", by Sheldahl, Northfield, Minn. Z-axis anisotropic adhesives are also sold by 3M, St. Paul, Minn.

The conductive adhesive layer 28 can be formed by blanket deposition of the anisotropic adhesive onto either the substrate 12 or the dice 14 using a suitable dispensing process. Alternately the conductive adhesive layer 28 can be deposited by stenciling or other suitable process to cover selected areas on the substrate 12 or the dice 14, such as the contact members 16 on the substrate 12, or the bond pads 18 on the dice 14. Once cured, the conductive adhesive layer 28 secures the bond pads 18 on the dice 14 to the contact members 16 on the substrate 12 in electrical communication therewith.

After formation of the conductive adhesive layer 28, an underfill layer can be formed between the substrate 12 and the dice 14. In FIG. 2, the underfill layer does not show because the gap in the depicted area is filled by the conductive adhesive layer 28. However, it is to be understood that the underfill layer can be formed in other areas between the substrate 12 and dice 14. For example, as shown in FIG. 5D, an underfill layer 34 (FIG. 5D) fills the gap between the substrate 12 and dice 14 and helps to further secure the dice 14 to the substrate 12. In addition, the underfill layer 34 (FIG. 5D) functions to electrically insulate the conductive adhesive layer 28 and exposed areas of the conductors 22.

The underfill layer can be an epoxy or elastomeric material formed using a suitable deposition process. For example, a thin layer of an underfill material can be dispensed into the gap between the substrate 12 and dice 14 using techniques that are known in the art and then drawn into the gap by capillary action. One suitable underfill material is "HYSOL BRAND FP4520" sold by Dexter Electronic Materials.

Referring to FIG. 2A, an alternate embodiment contact member 16A is illustrated. Contact member 16A is substantially identical to contact member 16 previously described but also includes one or more projections 44 formed on a tip portion thereof. The projections 44 are covered with the insulating layer 56 and the conductive layer 30 as previously explained. The projections 44 function to compress the conductive adhesive layer 28 and force the conductive particles 32 into contact with the bond pads 18. This forms a conductive path between the bond pads 18 on the die 14 and the conductive layer 30 for the contact members 16A.

Referring to FIG. 3, a memory module 36 fabricated using one or more multi-chip modules 10 constructed in accordance with the invention is shown. The memory module 36 includes a support substrate 38 formed of an insulating material such as FR-4, ceramic, silicon or a glass filled laminate. The support substrate 38 includes an edge connector 40 configured to electrically connect the memory module 36 to a computer or other electronic device. A pattern of circuit traces 42 is formed on the support substrate 38 in electrical communication with the edge connector 40.

One or more multi chip modules 10 can be attached to the supporting substrate 38 using a suitable adhesive material. An electrical pathway can be provided from the conductors 22 on the multi chip modules 10 to the circuit traces 42 on the supporting substrate 38 by bond wires 26. The bond wires 26 can be wire bonded to the contact pads 24 (FIG. 1) for the conductors 22 and to corresponding connection points associated with the circuit traces 42. Alternately, in place of bond wires 26, this electrical path can be formed by TAB tape or mechanical electrical connectors, such as spring contacts or slide contacts.

Referring to FIGS. 4A–4D, a process for forming the substrate 12 and contact members 16A for the multi chip module 10 is shown. In FIGS. 4A–4D, an edge 46 of the substrate 12 wherein the contact pads 24 for the conductors 22 will be formed is depicted on the right. Although in the embodiment illustrated in FIGS. 4A–4D, the contact members 16A include projections 44, a process for forming the contact members 16 without projections 44 would be the same as illustrated in FIGS. 4A–4D but without the additional steps associated with forming the projections 44.

Initially, as shown in FIG. 4A, the projections 44 can be formed by forming a mask (not shown) on the substrate 12 and then etching the substrate 12 through the mask. For example, a hard mask can be formed on the substrate 12 by depositing a layer of silicon nitride ($Si_3N_4$) and then patterning the silicon nitride layer using hot phosphoric acid. A wet or dry, isotropic or anisotropic, etch process can then be used to etch through openings in the hard mask to form the projections 44. For example, an anisotropic etch can be performed on a substrate 12 formed of silicon using a solution of KOH and $H_2O$.

The projections 44 can be elongated blades formed in locations that match the placement of the bond pads 18 (FIG. 2) on the dice 14. In the illustrative embodiment, there are four projections 44 per contact member 16A. However, a greater or lesser number can be formed. In addition, the projections 44 for each contact member 16A are formed in a pattern having an outline contained within the perimeter of the bond pads 18 (FIG. 2) on the dice 14. A representative height for the projections 44 measured from the base to the tip can be from 0.2 to 1 µm. A representative length for the projections 44 measured from end to end of the projections 44 can be from 3 to 10 µm.

Once the projections 44 are formed, the hard mask can be stripped and another mask (not shown) can be formed for etching the substrate 12 to form the contact members 16A (or 16). Using an anisotropic etch process, the contact members 16A (or 16) are formed as topographically elevated pillars generally conical in cross section. A representative height of the contact member 16A (or 16) from base to tip can be from 50–100 µm. A representative width of each side of the contact member 16A (or 16) can be from 40–80 µm. Following formation of the contact members 16A (or 16), the etch mask can be stripped.

Suitable etch processes for forming the contact member 16A (or 16) and projections 44 substantially as shown in FIG. 4A, are also disclosed in U.S. Pat. Nos. 5,326,428; 5,419,807 and 5,483,741 which are incorporated herein by reference.

Figure 4B:
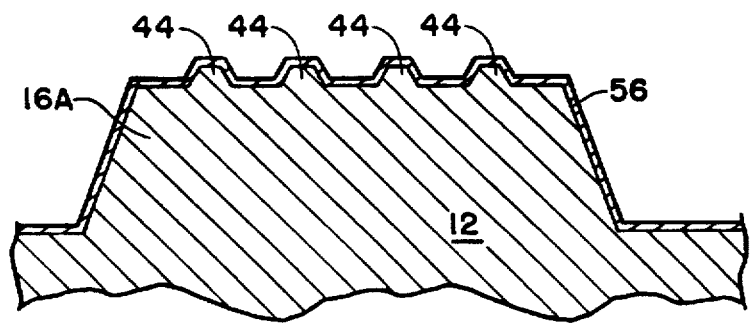

Referring to FIG. 4B, once the projections 44 and contact member 16A (or 16) are formed, the insulating layer 56 can be formed over the entire substrate 12. The insulating layer 56 can be a grown or deposited material such as $SiO_2$ or $Si_3N_4$. A representative thickness for the insulating layer 56 can be from 500 Å to 1 µm.

Figure 4C:
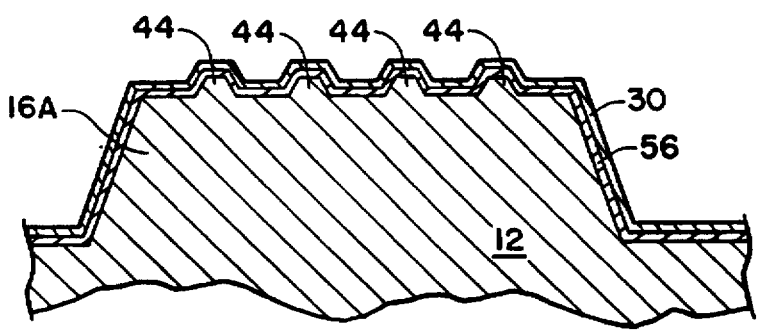

Next as shown in FIG. 4C, the conductive layer 30 for the contact members 16A (or 16) is formed on the insulating layer 56. To form the conductive layer 30, a highly conductive metal can be blanket deposited on the substrate 12 by sputtering or other deposition process. Exemplary metals include aluminum, platinum, palladium, copper, gold and silver or alloys of these metals. A representative thickness for the conductive layer 28 can be from 500 Å to 2 µm.

Following blanket deposition of the conductive layer 30, a resist mask can be formed and used for etching the conductive layer 30 such that the contact members 16A (or 16) remain covered with the conductive layer 30. The resist mask can be deposited using a standard photoresist deposition and exposure process. This can include spin deposition, followed by hardening, exposure and development. U.S. Pat. No. 5,607,818 incorporated herein by reference describes a method for patterning a conductive layer using an electrophoretically deposited layer of resist.

As an alternative to a metallization process (i.e., deposition, mask formation, etching), the conductive layer 30 can be formed as a metal silicide using a process as disclosed in U.S. Pat. No. 5,483,741 incorporated herein by reference.

During formation of the conductive layer 30, the conductors 22 and contact pads 24 can also be formed in electrical communication with the conductive layer 30 using the same material and metallization process used to form the conductive layer 30. Alternately the conductors 22 and contact pads 24 can be formed using different materials and a separate metallization process. For example, the conductors 22 and contact pads 24 can be formed using a process such as plating, thin film deposition or screen printing.

The contact pads 24 for the conductors 22 can be formed of a highly conductive material that is suitable for wire bonding. Preferred materials include gold and aluminum. The conductors 22 and contact pads 24 can also be formed of alloys of these metals or as stacks of these and other metals.

Figure 4D:
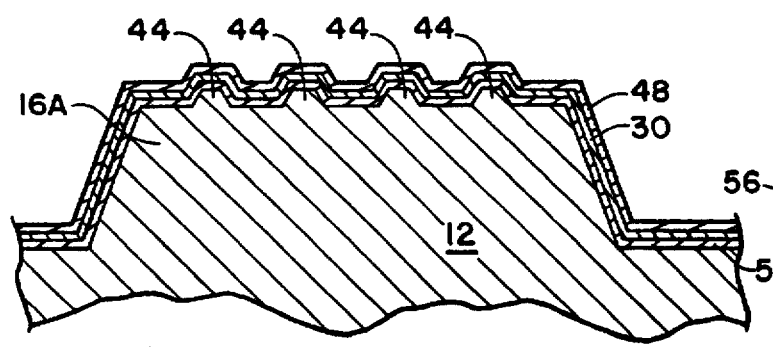

Following formation of the conductive layer 30 and as shown in FIG. 4D, a non-oxidizing cap layer 48 can be formed on the conductive layer 30. The cap layer 48 can be formed by a suitable metallization or plating process. The purpose of the cap layer 48 is to prevent oxidation such that the electrical connection between the conductive layer 30 and the conductive adhesive layer 28 (FIG. 2) is not inhibited by a metal oxide. Suitable materials for the cap layer 48 include palladium, gold, tungsten and platinum. Alloys of these metals such as gold-platinum, silver-palladium, silver-platinum and palladium-gold can also be utilized to form the cap layer 48. A representative thickness for the cap layer 48 can be from 200 Å to 2 µm.

One method of forming the cap layer 48 out of palladium or gold is by electroless plating. With electroless plating, an aqueous solution comprising metal ions and reducing agents is used. Compositions for these solutions for different metals are known in the art. If desired, the conductors 22 and the contact pads 24 can also be covered with a cap layer using the same deposition process.

Figure 5A:
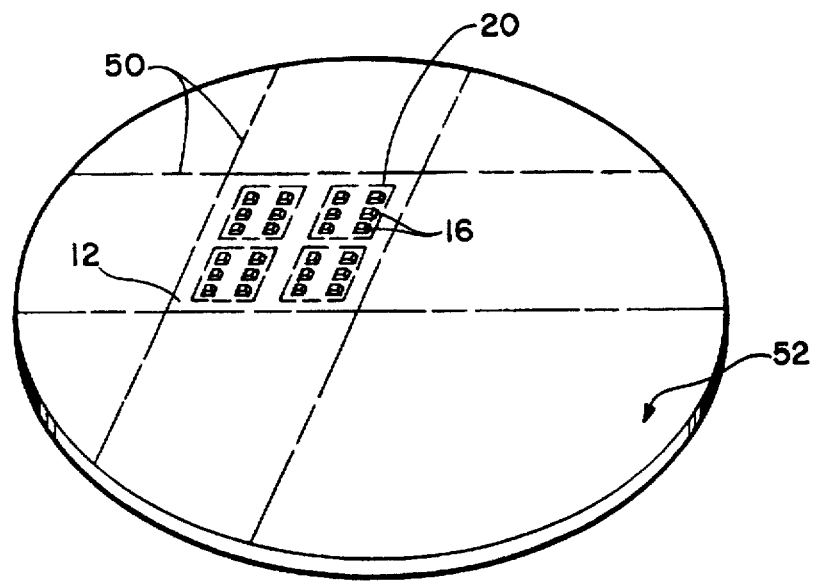
FIGS. 5A–5D are schematic views illustrating process steps in forming a multi chip module in accordance with the invention.
Figure 5B:
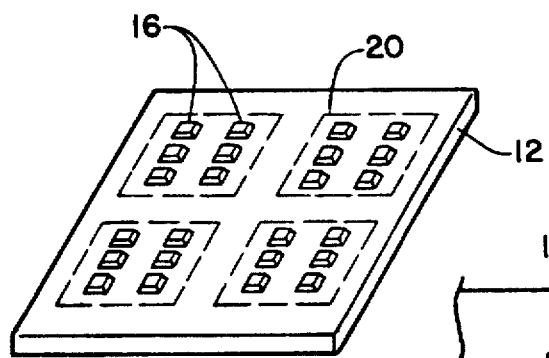
Figure 5C:
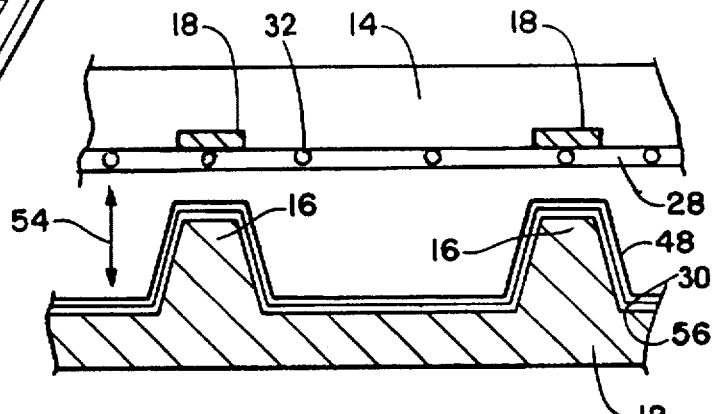
Figure 5D:
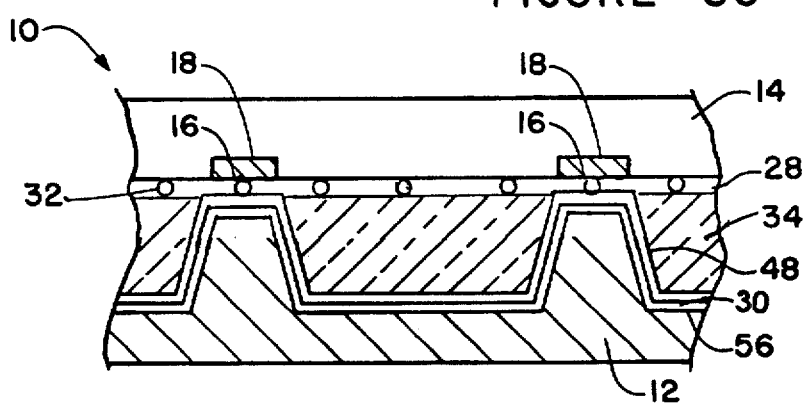

Referring to FIGS. 5A-5D, process steps in a method for forming the multi chip module 10 (FIG. 1) are shown. Initially as shown in FIG. 5A, a wafer 52 of material is provided. The wafer 52 is large enough to form a large number of substrates 12. Using the process outlined in FIGS. 4A-4D, a plurality of contact members 16 can be formed on the wafer 52. Each die bonding site 20 includes a required pattern of contact members 16. Following formation of the contact members 16, the wafer 52 is singulated along separation lines 50. Singulation can be by saw cutting, scribing or other suitable method.

As shown in FIG. 5B, singulation of the wafer 52 forms a plurality of substrates 12 each having a desired number of die bonding sites 20. In the embodiment illustrated in FIG. 5B, the substrate 12 includes four die bonding sites 20 for mounting four separate semiconductor dice 14. Alternately the substrate 12 can be formed with a greater or lesser number of die bonding sites 20 to accommodate from one die to die clusters comprising an entire semiconductor wafer.

Next, as shown in FIG. 5C, the conductive adhesive layer 28 is deposited on the dice 14 or alternately on the substrate 12. In the embodiment illustrated in FIG. 5C, the conductive adhesive layer 28 is deposited on the dice 14. The conductive adhesive layer 28 can be blanket deposited or can be patterned to cover only selected areas of the dice 14 or substrate 12.

Prior to attaching the dice 14 to the contact members 16, the bond pads 18 on the dice 14 must be aligned with the contact members 16. One method for aligning the contact members 16 with the bond pads 18 is with optical alignment techniques and aligner bonder tools used for flip chip bonding semiconductor dice. Flip chip bonding refers to a process wherein a semiconductor die is placed face down on a substrate, such as a printed circuit board, and the bond pads on the die are bonded to connection points on the substrate. Tools for flip chip bonding are sometimes referred to as aligner bonders. An aligner bonder and method of optical alignment for flip chip bonding are described in U.S. Pat. No. 4,899,921 to Bendat et al, entitled "Aligner Bonder". Such an aligner bonder is available from Research Devices of Piscataway, N.J.

In addition, U. S. Pat. No. 5,634,267 incorporated herein by reference, describes an automated apparatus suitable for optically aligning the contact members 16 on the substrate 12 with the bond pads 18 on the dice 14.

With these types of alignment devices, the substrate 12 and dice 14 are mounted on adjustable supports (not shown) that are movable in the x, y and z directions and in a rotational direction (theta). An optical probe (not shown) associated with the adjustable supports views the surfaces of the substrate 12 and dice 14 and forms an image on a video screen (not shown). By moving the adjustable supports as required, the bond pads 18 on the dice 14 can be aligned with the contact members 16 on the substrate 12 and the aligned surfaces brought into contact.

To facilitate the optical alignment process, the conductive adhesive layer 28 is preferably formed of a transparent or translucent material such that the bond pads 18 and contact members 16 can be viewed through the conductive adhesive layer 28. With the bond pads 18 and contact members 16 aligned, the dice 14 and substrate 12 can be moved together into contact as indicated by double headed arrow 54.

Figure 7:
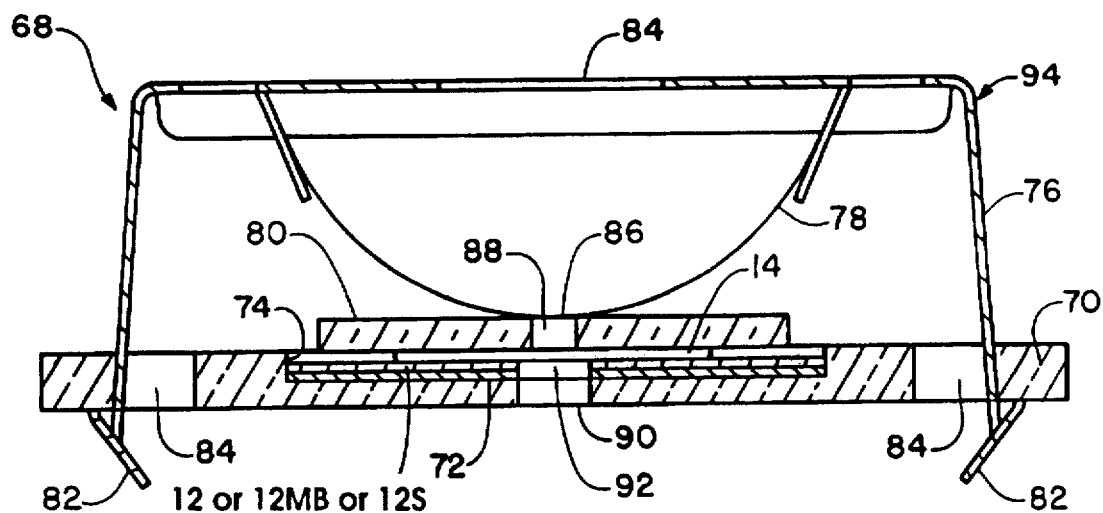
FIG. 7 is a cross sectional view of an apparatus assembling and aligning the dice with the substrate and for curing the conductive adhesive layer therebetween under compression.

Next, as shown in FIG. 5D, the conductive adhesive layer 28 can be cured under compression such that an electrical connection is formed between the contact members 16 on the substrate 12 and the bond pads 18 on the dice 14. As will be further explained, the conductive adhesive layer 28 can be compressed during curing using an apparatus 68 as shown in FIG. 7. The apparatus 68 is adapted to align and assemble the dice 14 and substrate 12 together with the conductive adhesive layer 28 compressed therebetween. Alternately, in place of apparatus 68, weights or jigs (not shown) can be operatively associated with the dice 14 and substrate 12 to assemble the substrate 12 and dice to cure the conductive adhesive layer 28.

During the curing process, the elevated topography of the contact members 16 ensures that the conductive adhesive layer 28 is compressed at points of contact with the bond pads 18. This compresses the conductive particles 32 together in the space between the bond pads 18 and contact members 16 so that an electrical connection is formed therebetween. If the contact members 16A (FIG. 2A) are formed with projections 44 (FIG. 2A), the projections 44 facilitate compression of the conductive particles 32 and penetration of any oxide material covering the bond pads 18.

As also shown in FIG. 5D, the underfill layer 34 can be formed between the dice 14 and substrate 12. The underfill layer 34 can be a deposited underfill material, as previously described, dispensed into the gap between the dice 14 and substrate 12 and then formed by capillary action.

With the completed multi chip module 10 shown in FIG. 5D, the conductive path to and from the die bond pads 18 is through the conductive adhesive layer 28, through the cap layer 48 and conductive layer 30 on the contact members 16, and through the conductors 22 (FIG. 1) and contact pads 24 (FIG. 1) on the substrate 12 to the outside world.

Referring to FIG. 6A, an alternate embodiment substrate 12MB having microbump contact members 16MB is shown. The microbump substrate 12MB includes an insulating film 64 formed of a flexible material, such as polyimide, and a pattern of conductors 22MB formed on the insulating film 64. The microbump substrate 12MB and microbump contact members 16MB function in substantially the same manner as the substrate 12 previously described. The microbump substrate 12MB can be formed of a rigid material such as silicon or other semiconductors as previously described or of ceramic, glass filled polymer, FR-4, or plastic material.

The microbump contact members 16MB are formed in vias through the insulating film 64 in electrical communication with the conductors 22MB. The microbump contact members 16MB can be an electroplated metal such as nickel, gold or copper. A representative diameter for the microbump contact members 16MB is from 15-100 µm depending on the size of the bond pads 18 on the die 14. A spacing for the microbump contact members 16MB will also depend on the spacing of the bond pads 18 but can be from 25-250 µm or greater.

The microbump conductors 22MB can be a highly conductive metal such as patterned copper foil laminated to the insulating film 64. The microbump contact members 16MB and conductors 22MB function substantially similar to the contact members 16 and conductors 22 previously described.

The insulating film 64, microbump contact members 16MB and conductors 22MB can be formed of multi layered TAB tape such as "ASMAT" manufactured by Nitto Denko, Inc. This type of TAB tape can be manufactured separately and then attached to the substrate 12MB using a compliant adhesive layer 66. A suitable process for attaching multi layered TAB tape to a substrate to form the microbump substrate 12MB substantially as shown in FIG. 6, is disclosed in U.S. Pat. No. 5,678,301, incorporated herein by reference.

To assemble a multi chip module using the microbump substrate 12MB, a conductive adhesive material is applied to the dice 14 or to the microbump substrate 12MB. The die bond pads 18 are then aligned with the microbump contacts 16MB using optical alignment or other suitable process as previously described. The dice 14 and microbump substrate 12MB can then be brought together to compress the conductive adhesive layer 28 therebetween as it is cured. In FIG. 6A, the conductive adhesive layer 28 and underfill layer 34 function substantially as previously described to secure the dice 14 to the microbump substrate 12MB and to establish an electrical connection therebetween.

Referring to FIG. 6B, another alternate embodiment multi chip module includes contact members 16S formed as bumps of metal or a conductive polymer deposited directly on a pattern of conductors 22S on the substrate 12S. The contact members 16S can be similar in size and shape to the microbumps 16MB previously described. In this embodiment the substrate 12S can be formed of a rigid material, such as silicon, or other semiconductors as previously described, or of ceramic, glass filled polymer, FR-4, or plastic material. The conductors 22S can be formed on the surface of the substrate 12S using a suitable metallization process (e.g., blanket deposition, photopatterning, etching). The contact members 16S can be a conductive metal such as nickel, gold, copper or solder, or a conductive polymer such as an isotropic or anisotropic material as previously described. One suitable conductive polymer is "ABLE-STICK" manufactured by AI Technology. One suitable deposition process for forming the contact members 16S as metal or conductive polymer bumps is by stenciling through a screen. Other suitable deposition processes for metal bumps include electroplating, electroless plating and evaporation.

Referring to FIG. 7, an apparatus 68 suitable for assembling the dice 14 and the substrate 12 (or 12MB or 12S) and curing the conductive adhesive layer 28 (FIG. 5D or 6) under compression is shown. The apparatus 68 is similar to the carrier disclosed in U.S. Pat. No. 5,519,332, incorporated herein by reference, used for testing unpackaged semiconductor dice. The apparatus 68 includes a base 70 and a force applying mechanism 94.

The base 70 can be formed of molded plastic or laminated ceramic and includes a recess 74 adapted to hold one or more dice 14 and the substrate 12 (or 12MB or 12S). If desired, the substrate 12 (or 12MB or 12S) can be attached to the base 70 using a removable adhesive 72.

The force applying mechanism 94 includes a bridge clamp 76, a spring 78 and a pressure plate 80 formed substantially as shown. The bridge clamp 76 includes clip portions 82 that removably attach to openings 84 formed in the base 70. In addition, the bridge clamp 76 includes an opening 84, the spring 78 includes an opening 86, and the pressure plate 80 includes an opening 88. These openings can be used in conjunction with an assembly apparatus such as an aligner bonder as previously described for assembling the apparatus 68. In addition, an opening 90 can be formed in the base 70 and an opening 92 can be formed in the substrate 12 (or 12MB or 12S) to permit manipulation of the dice 14 and substrate 12 (or 12MB or 12S) using suitable tools.

Using the apparatus 68 and the alignment procedure previously outlined, one or more dice 14 can be optically aligned with the substrate 12 (or 12MB or 12S). The dice 14 and substrate 12 (or 12MB or 12S) can then be placed in contact and the force applying mechanism 94 secured to the base 70. The force applying mechanism 94 biases the dice 14 against the substrate 12 (or 12MB or 12S) so that the conductive adhesive layer 28 (FIGS. 2 or 6) can be cured under compression.

Thus the invention provides an improved method for forming chip modules such as multi chip modules and memory modules. While the invention has been described with reference to certain preferred embodiments, as will be apparent to those skilled in the art, certain changes and modifications can be made without departing from the scope of the invention as defined by the following claims.

What is claimed is:

1. A method for fabricating a chip module, comprising:

providing a semiconductor die with a plurality of contact locations;

providing a substrate comprising a pattern of contact members formed thereon, said contact members comprising microbumps formed on an insulating film attached to the substrate, said contact members configured to provide electrical connections with the contact locations; and mounting a semiconductor die to the substrate using a conductive adhesive layer to electrically connect the contact members on the substrate to the contact locations on the die.

2. The method as claimed in claim 1 further comprising a conductor on the insulating film in electrical communication with each microbump.

3. The method as claimed in claim 1 wherein the insulating film comprises a multi layered tape.

4. The method as claimed in claim 1 further comprising forming a cap layer on each microbump, said cap layer comprising a non-oxidizing material.

5. The method as claimed in claim 1 further comprising forming a cap layer on each microbump, said cap layer comprises a material selected from the group consisting of gold, palladium, tungsten, platinum and alloys of these materials.

6. The method as claimed in claim 1 wherein the insulating film comprises a multi layered tape with conductors thereon, said microbumps in electrical communication with the conductors.

7. The method as claimed in claim 1 further comprising forming an adhesive layer between the substrate and the insulating film.

8. The method as claimed in claim 1 further comprising forming an underfill layer between the insulating film and the substrate.

9. A method for fabricating a chip module comprising:

providing a semiconductor die with a contact location;

providing a substrate;

attaching an insulating film to the substrate, said insulating film comprising a microbump and a conductor in electrical communication with the microbump;

applying a conductive adhesive layer to the microbump or to the contact location;

aligning the microbump with the contact location;

compressing the conductive adhesive layer between the microbump and the contact location to attach the die to the substrate and establish electrical communication between the microbump and the contact location; and curing the conductive adhesive layer.

10. The method as claimed in claim 9 further comprising forming an underfill layer between the die and the insulating film.

11. The method as claimed in claim 9 further comprising forming a cap layer on the microbump, said cap layer comprising a non oxidizing metal.

12. The method as claimed in claim 9 wherein the insulating film comprises multi layered TAB tape.

13. The method as claimed in claim 9 further comprising providing a conductor on the insulating film in electrical communication with the microbump.

14. The method as claimed in claim 9 wherein the insulating film comprises a polymer tape.

15. The method as claimed in claim 9 wherein attaching the insulating film to the substrate comprises forming an adhesive layer therebetween.

16. A method for fabricating a chip module comprising:

providing a substrate;

providing a semiconductor die with a plurality of contact locations;

forming a pattern of contact members on the substrate corresponding to the contact locations;

applying an anisotropic conductive adhesive to the contact members or to the contact locations;

aligning the contact members with the contact locations;

assembling the substrate and die together with the anisotropic conductive adhesive compressed therebetween; and curing the conductive anisotropic adhesive to secure the die to the substrate and to form separate conductive paths between the contact members and the contact locations.

17. The method as claimed in claim 16 wherein each contact member comprises a bi-metal stack including a base layer and a non-oxidizing cap layer.

18. The method as claimed in claim 16 further comprising forming each contact member with at least one projection configured to press the anisotropic conductive adhesive layer against a contact location.

19. The method as claimed in claim 16 wherein the contact members comprise microbumps on a flexible tape.

20. The method as claimed in claim 16 the contact members comprise metal or conductive polymer bumps on a pattern of conductors on the substrate.

21. The method as claimed in claim 16 further comprising forming an underfill layer between the die and substrate.

22. The method as claimed in claim 16 further comprising forming a memory module by mounting the substrate to a supporting substrate and electrically connecting the contact members on the substrate to an edge connector on the supporting substrate.

23. The method as claimed in claim 16 wherein the anisotropic conductive adhesive comprises a z-axis epoxy.

24. A method for forming a chip module comprising:

providing a wafer;

providing a semiconductor die including a plurality of contact locations;

forming a die bonding site on the wafer comprising a plurality of raised contact members configured to form electrical connections with the contact locations on the die;

forming a conductive layer on each contact member;

singulating the wafer to form a substrate including the die bonding site;

applying a conductive adhesive to the contact members on the substrate or to the contact locations on the die; and compressing the conductive adhesive between the contact members on the substrate and the contact locations on the die to form separate electrical paths therebetween.

25. The method as claimed in claim 24 further comprising optically aligning the contact members on the substrate with the contact locations on the die prior to the compressing step.

26. The method as claimed in claim 24 further comprising forming the conductive layer as a bi-metal stack including a base layer and a non-oxidizing cap layer.

27. The method as claimed in claim 24 further comprising forming each contact member with at least one projection configured to press the conductive adhesive layer into contact with a contact location.

28. The method as claimed in claim 24 further comprising forming an underfill layer between the die and substrate.

29. The method as claimed in claim 24 wherein the substrate includes a plurality of die bonding sites for a plurality of dice.

30. The method as claimed in claim 24 wherein forming the contact members comprises etching the substrate.

31. The method as claimed in claim 24 further comprising forming a plurality of conductors on the substrate in electrical communication with the contact members.

* * * * *